United States Patent
Lof et al.

(10) Patent No.: US 7,193,231 B2
(45) Date of Patent: Mar. 20, 2007

(54) ALIGNMENT TOOL, A LITHOGRAPHIC APPARATUS, AN ALIGNMENT METHOD, A DEVICE MANUFACTURING METHOD AND DEVICE MANUFACTURED THEREBY

(75) Inventors: Joeri Lof, Eindhoven (NL); Fransiscus Godefridus Casper Bijnen, Valkenswaard (NL); Henricus Wilhelmus Maria Van Buel, Eindhoven (NL); Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 8 days.

(21) Appl. No.: 10/648,785

(22) Filed: Aug. 27, 2003

(65) Prior Publication Data

US 2004/0108466 A1   Jun. 10, 2004

(30) Foreign Application Priority Data

Aug. 29, 2002   (EP)   ................................ 02256016

(51) Int. Cl.
*G01B 11/00* (2006.01)

(52) U.S. Cl. ...................................... 250/548; 356/401

(58) Field of Classification Search ................ 250/548, 250/201, 215, 237, 237 R, 221; 356/401; 35/356; 355/53–55

See application file for complete search history.

(56) References Cited

U.S. PATENT DOCUMENTS

| | | | | |
|---|---|---|---|---|
| 4,616,130 A | * | 10/1986 | Omata | 250/201.4 |
| 4,630,922 A | | 12/1986 | Imai et al. | 355/55 |
| 4,798,470 A | * | 1/1989 | Moriyama | 356/401 |
| 5,481,362 A | * | 1/1996 | Van Den Brink | 356/401 |
| 2001/0023918 A1 | | 9/2001 | Kondo | 250/201.2 |

FOREIGN PATENT DOCUMENTS

| | | |
|---|---|---|
| JP | 61-213814 | 9/1986 |
| JP | 3-61802 | 3/1991 |
| JP | 5-47631 | 2/1993 |
| JP | 8-288213 | 11/1996 |
| JP | 11-274065 | 10/1999 |
| JP | 2001-257157 | 9/2001 |

* cited by examiner

*Primary Examiner*—Thanh X. Luu
*Assistant Examiner*—Tony Ko
(74) *Attorney, Agent, or Firm*—Pillsbury Winthrop Shaw Pittman, LLP (57) ABSTRACT

An optical element is placed in the alignment beam during alignment. The optical element serves to focus the alignment beam onto the substrate alignment mark when it is at a different focal length from the front surface of the substrate.

23 Claims, 6 Drawing Sheets

ALIGNMENT TOOL, A LITHOGRAPHIC APPARATUS, AN ALIGNMENT METHOD, A DEVICE MANUFACTURING METHOD AND DEVICE MANUFACTURED THEREBY

CROSS REFERENCE TO RELATED APPLICATIONS

This application claims priority to European application No. 02256016.3, filed Aug. 29, 2002.

BACKGROUND OF THE INVENTION

1. Field of the Invention

The present invention relates to an alignment tool, a lithographic projection apparatus, an alignment method, a device manufacturing method and a device manufactured thereby.

2. Description of the Related Art

The term "parterning device" as here employed should be broadly interpreted as referring to device that can be used to endow an incoming radiation beam with a patterned cross-section, corresponding to a pattern that is to be creamed in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held am a desired position in the incoming radiation beam, and that it can be moved relative to the beam if so desired.

Another example of a patterning device is a programmable minor array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators.

Once again, the mirrors are mairix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable minor arrays. More information on mirror arrays as here referred to can be seen, for example, from U.S. Pat. No. 5,296,891 and 5,523,193, and WO 98/38597 and WO 98/33096. In the case of a programmable minor array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Before exposing the substrate, it must be correctly aligned. A mark is provided on the substrate and detected with an alignment system. The substrate mark can be on the front side (the side on which the component parts will be etched) or the backside of the substrate. If the substrate mark is on the backside of the substrate the substrate table includes front-to-backside alignment optics to direct the light beam (the alignment beam) to the bottom side of the substrate. The front-to-backside alignment optics can includes mirrors embedded into the substrate table.

The substrate mark may not be at the same level as the exposure surface of the substrate. For example, it may be in a pit etched into the substrate, or it may be on the surface of a substrate to which a further substrate has been adhered (leaving the substrate mark uncovered, or etching down to it). The exposure apparatus is engineered to ensure that the projection beam will focus on the front surface of the substrate (which is exposed to form the circuit devices). As the alignment beam often traverses the same optics it will also be in focus on the surface of the substrate and if the substrate mark is not at this surface the alignment beam will therefore be out of focus on the alignment mark. This invention is particularly applicable to substrates used in micro-electromechanical systems, in which the level of the substrate mark can differ from the surface of the substrate quite substantially.

SUMMARY OF THE INVENTION

It is an aspect of the present invention to provide an alignment tool which allows for a variable depth of focus of the alignment beam.

This and other aspects are achieved according to the invention in an alignment tool including a substrate table configured to hold a substrate having a substrate mark, wherein the substrate mark may be at a different level from the rest of the surface of the substrate. An alignment system is configured to detect alignment between a reference mark and the substrate mark using an alignment beam of radiation. An optical element is removably positionable in the path of the alignment beam for adjusting the focal plane of the alignment system to focus on the substrate mark at a different level from the rest of the surface of the substrate when detecting alignment.

The optical element is capable of adjusting the focal point of the alignment by up to 2 mm. Optionally, it adjusts the focal plane of the alignment system by at least 0.1 mm.

The optical element focuses the alignment beam onto the substrate mark which is at a different level from the rest of the surface of the substrate and is easily implementable to adjust the focus point. The optical element can adjust the focal plane of the alignment beam by up to 2 mm. Plane plates are particularly suitable as optical elements as they are easy to manufacture and don't require accurate axial placement. If the apparatus contains a plurality of interchangeable optical elements one can be chosen from the plurality according to the depth of focus needed for a particular alignment mark. Each of the plurality of optical elements has different thicknesses, or has different optical properties, for example refractive indices. Optionally the optical elements are hollow, each optical element being filled with a fluid having a different refractive index. Alternatively the position of the optical element along the alignment beam could be altered to adjust the focal plane of the alignment beam.

According to an embodiment the optical element is hollow and filled with a fluid, the composition of the fluid being adjustable to change the refractive index of the optical element. Optionally the refractive index of the optical element is changed by changing the salt concentration of the fluid or by changing the ratio of mixture of two fluids in the optical element, each fluid having a different refractive index.

The optical element can be used to adjust the focal plane of the alignment system in a direction parallel to the direction of propagation of the alignment beam i.e. the z direction. Alternatively, or additionally, the optical element adjusts the focal plane of the alignment system in a direction perpendicular to the direction of propagation of the alignment beam. This can be achieved by adjusting the angle of the optical element relative to the alignment beam or by adjusting the shape of the optical element.

The apparatus can include plurality of optical elements removably positionable in the path of the alignment beam such that one or more may be simultaneously in the path of the alignment beam.

The alignment system includes a projection system and the optical element can be placed in the alignment beam directly after the projection system, directly before the projection system, or be attached to the substrate table. If front-to-backside alignment optics are used to direct the alignment beam to the back of the substrate the optical element can be placed on the entrance to the front-to-backside alignment optics.

According to a further aspect of the invention there is provided a lithographic projection apparatus including a radiation system configured to provide a beam of radiation, a support configured to support a patterning device, the patterning device configured to pattern the beam of radiation according to a desired pattern, a projection system configured to project the patterned beam onto a target portion of the substrate; and an alignment tool as described above.

According to a further aspect of the invention there is provided an alignment method including providing an alignment beam of radiation, providing an alignment system to project the aligoment beam of radiation onto a substrate mark which may be at a different level from the rest of the surface of the substrate, and adjusting the focal plane of the alignment beam to focus on the substrate mark at a different level from the rest of the surface of the substrate by interposing an optical element into the alignment beam while detecting alignment.

The optical element can adjust the focal plane of the alignment system by up to 2 mm. Furthermore, the optical element adjusts the focal plane of the alignment system by at least 0.1 mm.

According to a further aspect of the invention there is provided a device manufacturing method including projecting a patterned beam of radiation onto a target portion of a layer of radiation-sensitive material at least partially covering a substrate, and an alignment method as described above.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
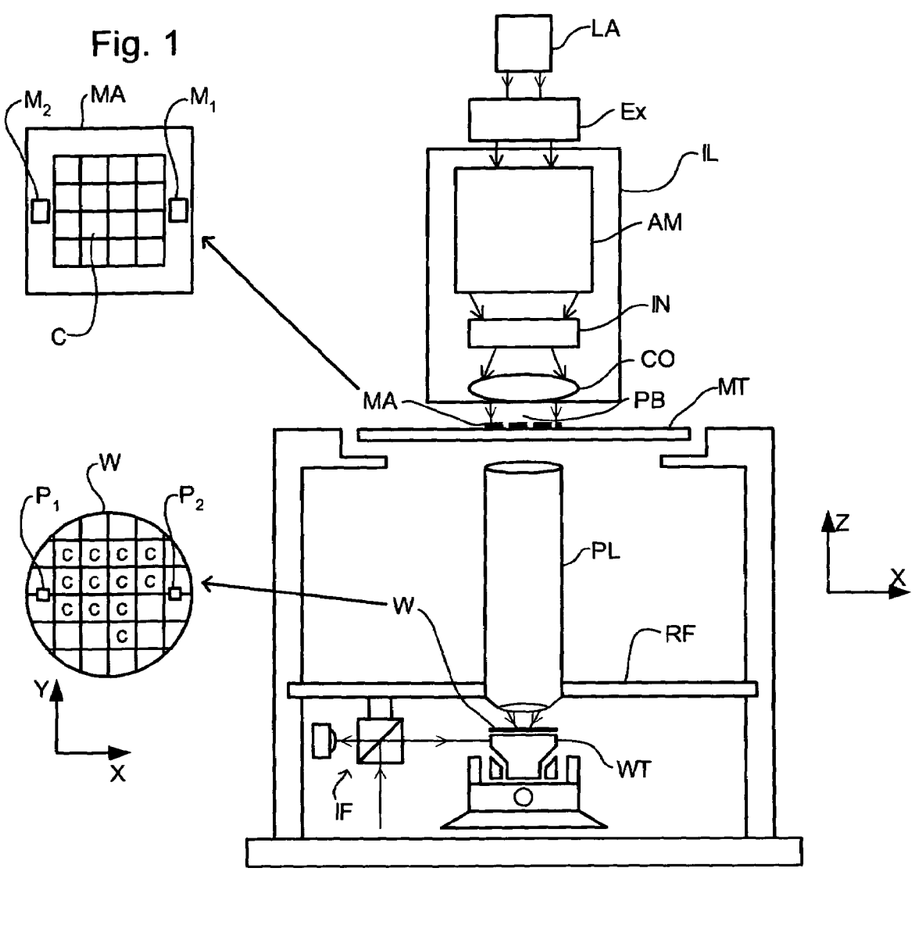
FIG. 1 depicts a lithographic projection apparatus according to an embodiment of the present invention.

FIG. 1 schematically depicts a lithographic projection apparatus 1 according to an embodiment of the present invention. The apparatus includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system or lens PL. The projection system or lens PL (e.g. a quartz and/or $CaF_2$ lens system or a refractive or catadioptric system, a mirror group or an array of field deflectors) is configured to image an irradiated portion of the mask MA onto a target portion C (e.g., comprising one or more dies) of the substrate W.

The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM configured to set the outer and/or wner radial extent (commonly referred to as σ-outer and σ-inner, respectively) of the intensity distribution in the beam. In addition, it will generally comprise various other components, such as an integrator IN and a condenser CO. In this way, the beam of radiation PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios.

In particular, the present invention encompasses embodiments wherein the illuminator IL is configured to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and inrerferorneter(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash" onto a target portion C. The substrate table WT is then shifted in the X and/or Y directions so that a different target portion C can be irradiated by the beam PB;
2. In scan mode, essentially the same scenario applies, except that a given target portion C is nor exposed in a single "flash." Instead, the mask table MT is movable in a given direction (the so-called "scan direction", e.g. the Y direction) with a speed v, so that the beam PB is caused to scan over a mask image. Concurrently, the substrate table WT is siintiltaneously moved in the same or opposite direction at a speed V =Mv, in which M is the magnification of the lens PL (typically, M =¼ or ⅕). In this manner, a relatively large target portion C can be exposed, without having to compromise on resolution.

Figure 2:
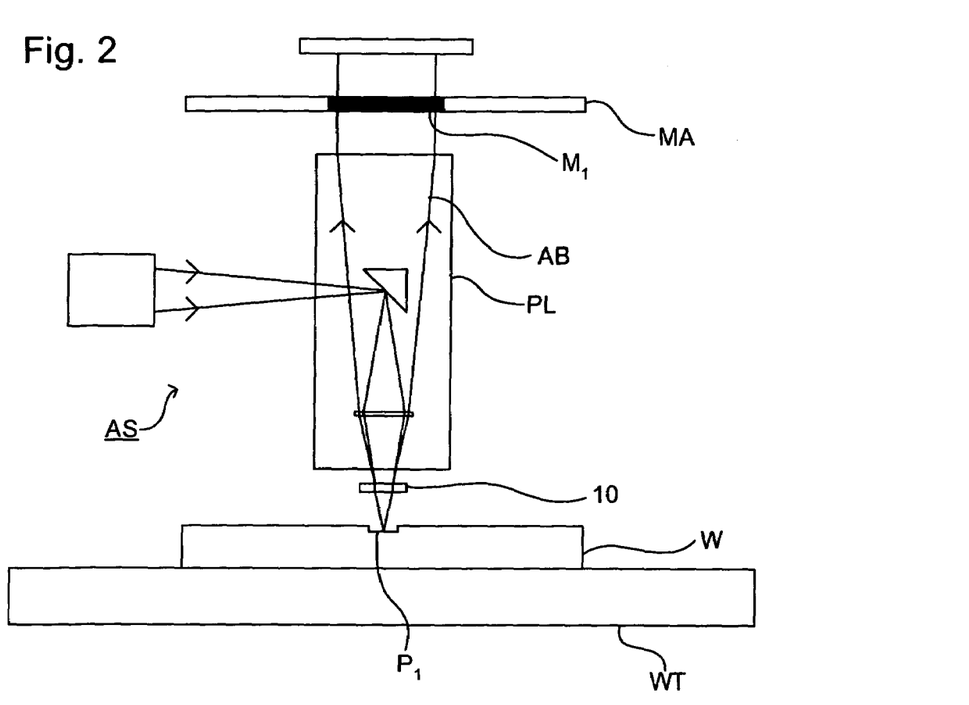
FIG. 2 is a diagram showing the arrangement of an optical element in a lithographic apparatus according to an embodiment of the present invention.

Prior to exposure of the substrate, alignment of the mask MA and substrate W takes place. Complementary alignment marks $M_1$, $M_2$ and substrate marks $P_1$, $P_2$ are present on the mask MA and substrate W respectively. In FIG. 2 an alignment beam AB is projected through the projection system PL. As can be seen the substrate mark $P_1$ is in a pit in the top surface of the substrate W. To adjust the focal plane of the alignment beam AB to the level of the substrate mark $P_1$ an optical element 10 is inserted into the alignment beam after the projection system PL. In this example the optical element 10 used is a plane plate 10. However, convex or concave mirrors or other refractive elements could also be used. For a required optical path offset of do generated by a material of refractive index no, the plane plate should have a thickness, $d_p$, given by $d_p = c \cdot d_o$ where $$c = \frac{n_1}{n_1 - n_0}$$

where $n_1$ is the refractive index of the plane plate 10.

The alignment beam is partially reflected from the substrate mark $P_1$ through the alignment system AS. The alignment beam is then imaged onto the alignment mark $M_1$. The alignment of the substrate mark $P_1$ and alignment mark $M_1$ can be detected in a known manner to determine the alignment of the substrate W.

Figure 3:
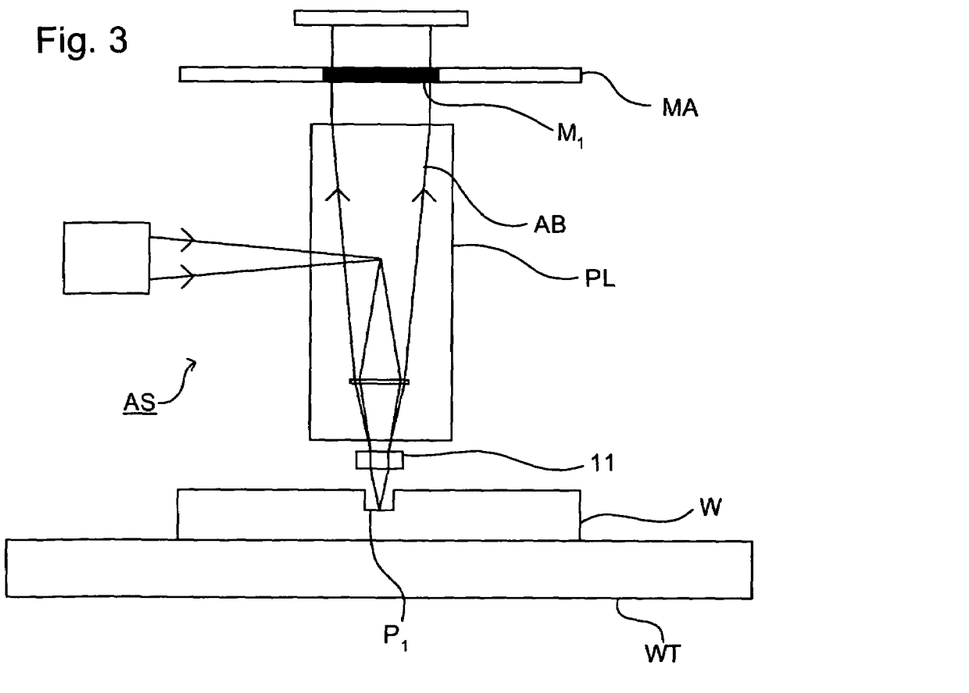
FIG. 3 is a diagram showing an arrangement of an optical element for a deeper etched alignment mark.

In FIG. 3 the substrate mark $P_1$ is in a deeper pit and a different plane plate 11 is therefore used to adjust the focal length. Here the plane plate 11 is thicker, but a different shaped optical element could be used or a plane plate made of a material with different optical properties.

Figure 4:
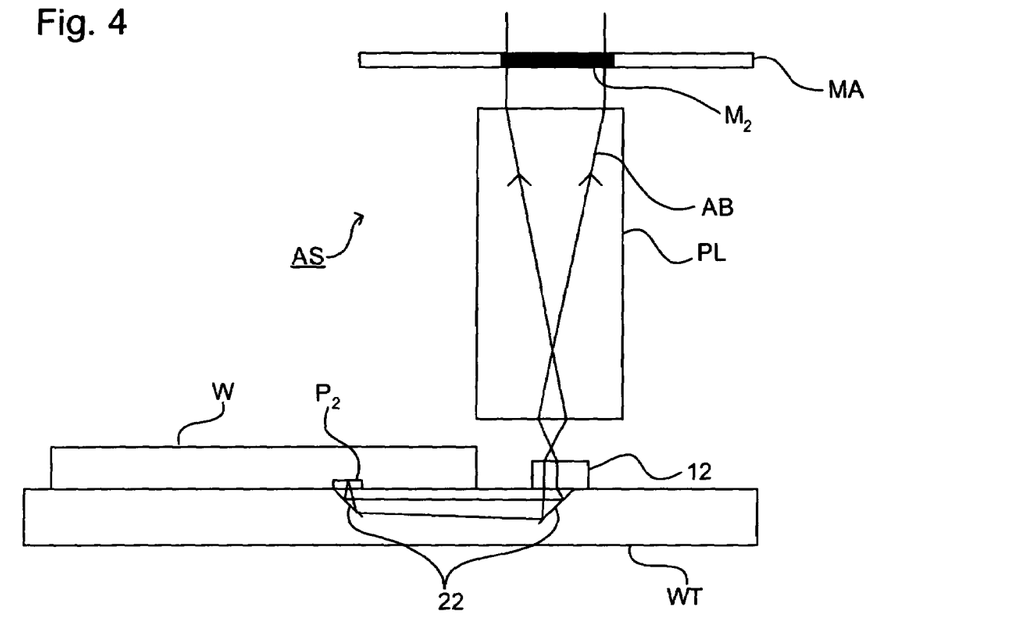
FIG. 4 is a diagram showing an arrangement of an optical element for use with front-to-backside alignment optics.

In FIG. 4 the substrate mark $P_2$ is in a pit below the bottom surface of the substrate and so the optical path length of the alignment beam projected onto the bottom of the substrate by front-to-backside alignment optics 22 would differ from the optical path length of the alignment beam projected onto the substrate mark $P_1$. The substrate mark $P_2$ is re-imaged by the front-to-backside alignment optics 22 at the side of the substrate W. Optical element 12 compensates for the pit in which the substrate mark $P_2$ is in, and shifts the image to the same level as the front of the substrate W.

Figure 5:
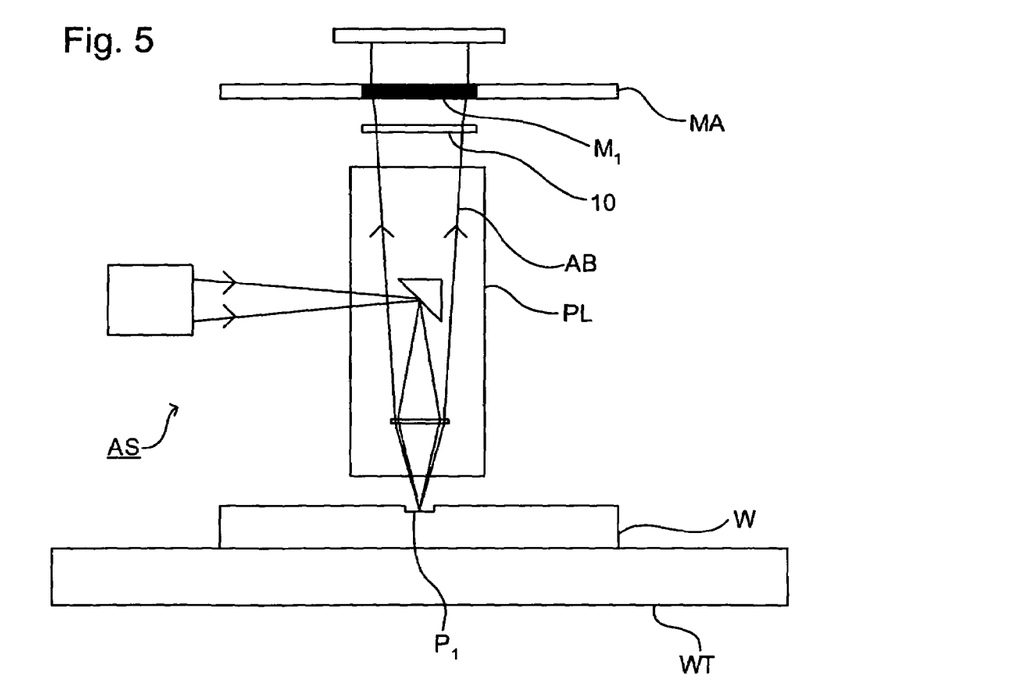
FIG. 5 is a diagram showing an alternative arrangement of an optical element in a lithographic apparatus.

FIG. 5 shows an embodiment of the invention in which the plane plate 10 is between the mask MA and the projection system PL.

Figure 6:
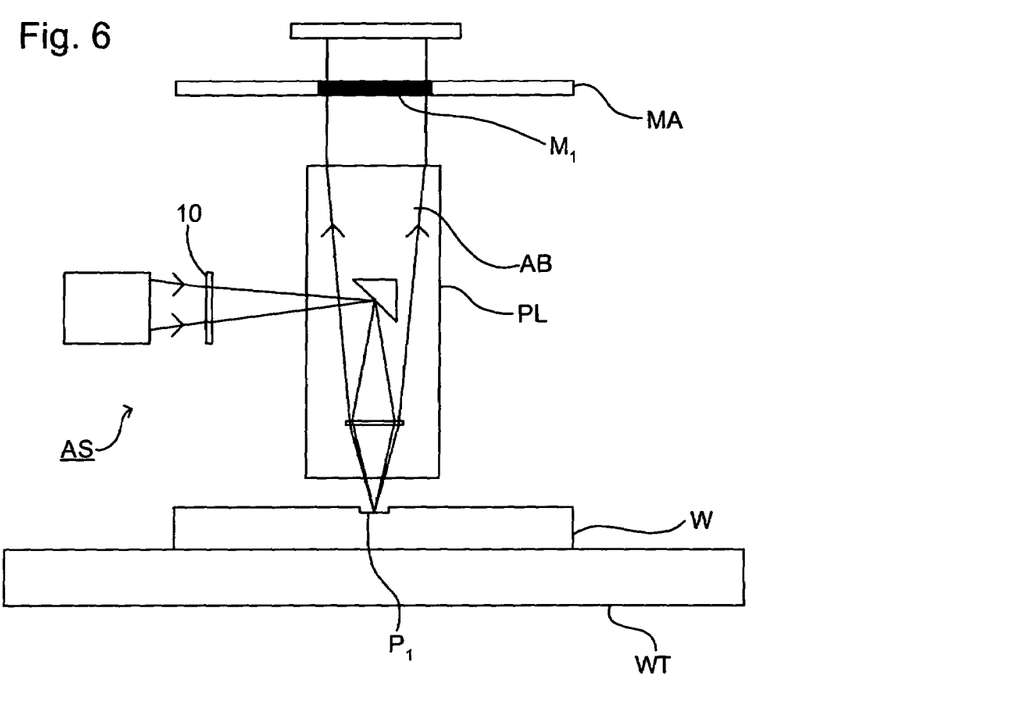
FIG. 6 is a diagram showing another alternative arrangement of an optical element in a lithographic apparatus.

FIG. 6 shows an embodiment of the present invention in which the plane plate 10 is placed in the path of the alignment beam AB prior to the alignment beam being projected through the projection system PL.

Figure 7:
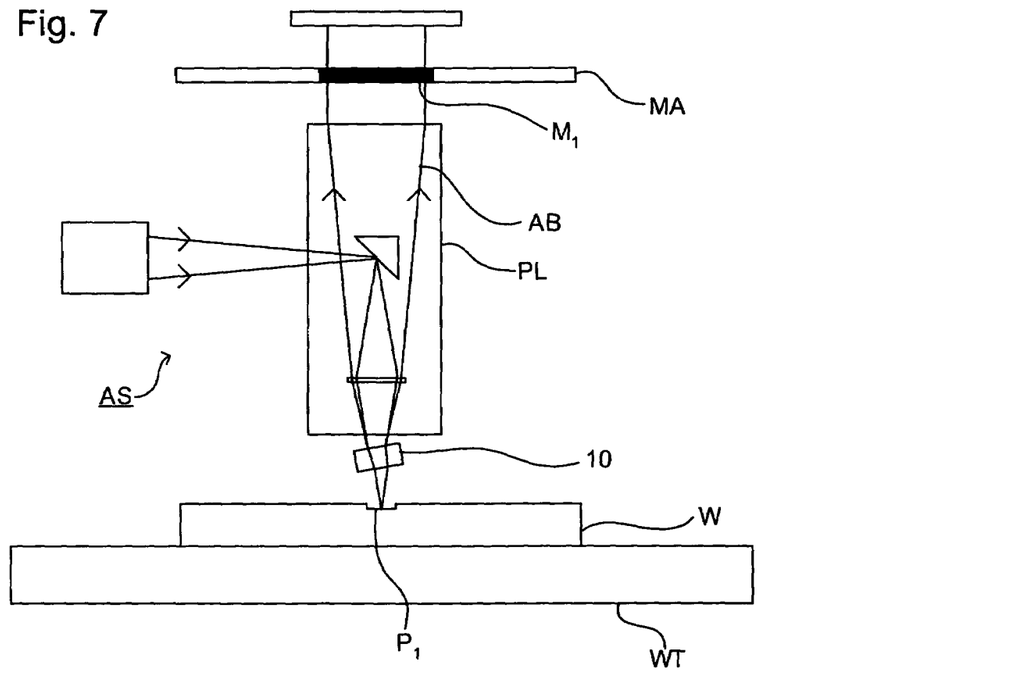
FIG. 7 is a diagram showing an arrangement of an optical element to adjust the focus in an x and/or y direction.

In addition to offsetting the optical path in the z direction in the embodiments above, the optical element 10 can also be used to adjust the optical path in other directions, e.g. in the plane perpendicular to the z direction. As shown in FIG. 7 the plane plate 10 is placed at an acute angle to the direction of propagation of the alignment beam AB. The alignment beam AB can thus be brought accurately into focus on a substrate mark $P_1$ shifted both in the z direction and in the x and/or y direction. The angle of the optical element 10 can be varied to adjust the focal plane in the x and/or y direction.

Figure 8:
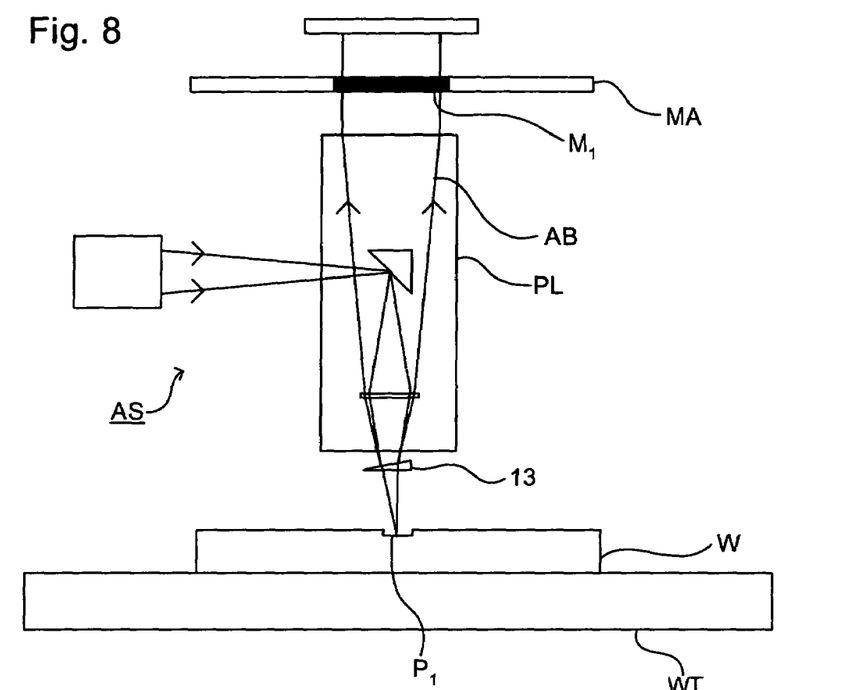
FIG. 8 is a diagram showing an alternative arrangement of an optical element to adjust the focus in an x and/or y direction.

The x and/or y offset can also be achieved using optical elements other than plane plates. For example, a wedge shaped optical element 13 shown in FIG. 8 is a compact and accurate way of generating an x or y offset. The optical element 13 can then simply be placed in the alignment beam without needing to precisely measure the angle optical element is placed at with respect to the alignment beam.

Figure 9:
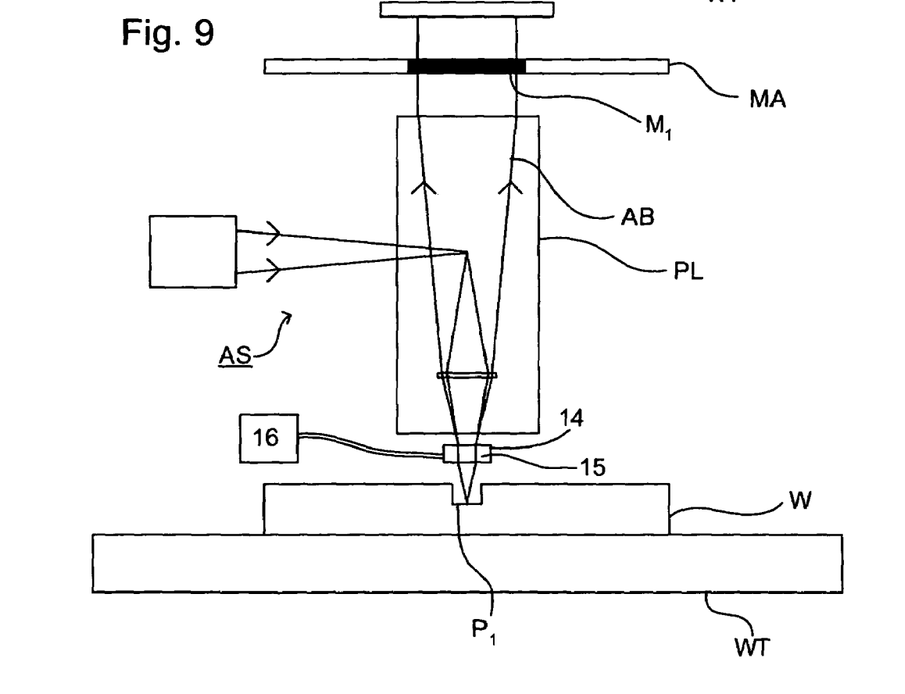
FIG. 9 is a diagram showing an arrangement of an optical element filled with fluid in a lithographic apparatus.

In an alternative embodiment, the optical element 10 in the path of the alignment beam AB is of fixed thickness $d_p$ but the refractive index of the optical element 10 is varied. This could be achieved by replacing a plane plate made of, for example glass by a plane plate made of, for example, perspex. Alternatively, the optical element could be a hollow plane plate filled with a fluid of known refractive index. The refractive index of the optical element 10 is then varied by changing the composition of the fluid. As shown in FIG. 9, the fluid 15 inside the optical element 14 can be replaced and the composition adjusted by the fluid replacement device 16. The composition can be adjusted by, for example, changing the salt concentration in the fluid or changing the ratio of two fluids in a mixture. The replacement and refreshment of the fluid 15 in the optical element 14 also keeps the optical element 14 cool, thus reducing errors and damage caused by thermal expansion and contraction of components.

Figure 10:
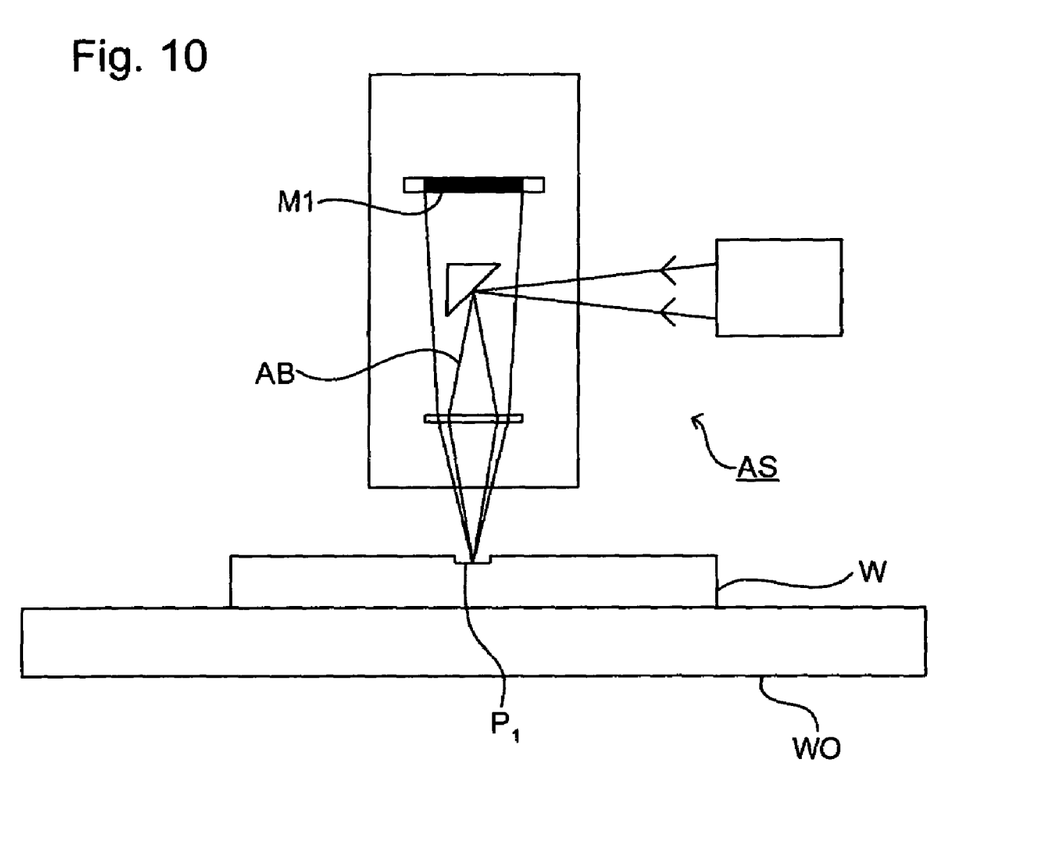
FIG. 10 shows the arrangement of an optical element in an alignment tool.

FIG. 10 shows a separate alignment tool in which the alignment system AS is separate from projection system. The alignment system AS projects the alignment beam AB towards the substrate mark $P_1$ on the substrate W. In this embodiment the substrate W is on a substrate table WO of an alignment tool. The alignment beam is partially reflected from the substrate mark $P_1$ and imaged onto alignment mark $M_1$ to detect alignment. Such an alignment tool can be used in conjunction with a lithographic apparatus without an alignment mechanism to align the substrate W. The substrate W is transferred between the substrate table WO of the alignment tool and the substrate table WT of the lithographic apparatus with sufficient precision to maintain the alignment accuracy.

For a larger focus offset a plurality of optical elements can be combined. Alternatively one optical element can be used to control the focus offset in the z direction and another used to control the focus offset in the x and y directions.

While specific embodiments of the invention have been described above, it will be appreciated that the invention may be practiced otherwise than as described. The description is not intended to limit the invention.

What is claimed is:

1. An alignment tool, comprising:
   a substrate table configured to hold a substrate having a substrate mark, wherein the substrate mark is at a different level from the rest of the surface of the substrate; and
   an alignment system configured to detect alignment between a reference mark and the substrate mark using an alignment beam of radiation, wherein an optical element is adjustably positionable in the path of the alignment beam to adjust the focal plane of the alignment system to focus on the substrate mark at the different level from the rest of the surface of the substrate.

2. An alignment tool according to claim 1, wherein the optical element is a plane plate.

3. An alignment tool according to claim 1, wherein the optical element adjusts the focal plane of the alignment system by up to 2 mm.

4. An alignment tool according to claim 1, wherein the optical element adjusts the focal plane of the alignment system by at least 0.1 mm.

5. An alignment tool according to claim 1, wherein the alignment system comprises a projection system and the optical element is placed in the path of the alignment beam directly after the alignment system.

6. An alignment tool according to claim 1, wherein the optical element is attached to the substrate table.

7. An alignment tool according claim 1, further comprising front-to-backside alignment optics configured to direct the alignment beam to the back of the substrate and in which the optical element is placed on the entrance to the front-to-backside alignment optics.

8. An alignment tool according to claim 5, wherein the position of the optical element along the alignment beam is altered to adjust the focal plane of the alignment beam.

9. An alignment tool according to claim 1, wherein the optical element comprises a plurality of interchangeable optical elements.

10. An alignment tool according claim 9, wherein the plurality of interchangeable optical elements have different thicknesses.

11. An alignment tool according to claim 9, wherein the plurality of interchangeable optical elements have different optical properties.

12. An alignment tool according to claim 11, wherein the different optical properties are different refractive indices.

13. An alignment tool according to claim 12, wherein the optical elements are hollow, each optical element being filled with a fluid having a different refractive index.

14. An alignment tool according to claim 1, wherein the optical element is hollow and filled with a fluid, the composition of the fluid being adjustable to change the refractive index of the optical element.

15. An alignment tool according to claim 14, wherein the refractive index of the optical element is changed by changing a salt concentration of the fluid.

16. An alignment tool according to claim 14, wherein the refractive index of the optical element is changed by changing the ratio of mixture of two fluids in the optical element, each fluid having a different refractive index.

17. An alignment tool according to claim 1, wherein the optical element comprises a plurality of optical elements adjustably positionable in the path of the alignment beam such that one or more of the optical elements may be simultaneously in the path of the alignment beam.

18. An alignment tool according to claim 1, wherein the optical element adjusts the focal plane of the alignment system in a direction parallel to the direction of propagation of the alignment beam.

19. An alignment tool according to claim 1, wherein the optical element adjusts the focal plane of the alignment system in a direction perpendicular to the direction of propagation of the alignment beam.

20. A lithographic projection apparatus, comprising:
   a radiation system configured to provide a beam of radiation;
   a support configured to support a patterning device, the patterning device configured to pattern the beam of radiation according to a desired pattern;
   a projection system configured to project the patterned beam onto a target portion of a substrate; and
   an alignment tool including
      a substrate table configured to hold the substrate having a substrate mark, wherein the substrate mark is at a different level from the rest of the surface of the substrate; and
      an alignment system configured to detect alignment between a reference mark and the substrate mark using an alignment beam of radiation, wherein an optical element is adjustably positionable in the path of the alignment beam to adjust the focal plane of the alignment system to focus on the substrate mark at the different level from the rest of the surface of the substrate.

21. An apparatus according to claim 20, wherein the alignment beam traverses at least part of the projection system.

22. An alignment method, comprising:
   projecting an alignment beam of radiation onto a substrate mark provided on a substrate, wherein the substrate mark is at a different level from the rest of the surface of the substrate; and
   adjusting the focal plane of the alignment beam to focus on the substrate mark at the different level from the rest of the surface of the substrate by interposing an optical element into the alignment beam while detecting alignment.

23. A device manufacturing method, comprising:
   projecting a patterned beam of radiation onto a target portion of a layer of radiation-sensitive material at least partially covering a substrate; and
   an alignment method including
      projecting an alignment beam of radiation onto a substrate mark which is at a different level from the rest of the surface of the substrate; and
      adjusting the focal plane of the alignment beam to focus on the substrate mark at the different level from the rest of the surface of the substrate by interposing an optical element into the alignment beam while detecting alignment.

* * * * *